United States Patent [19]

Kim et al.

[11] Patent Number: 5,643,817

[45] Date of Patent: Jul. 1, 1997

[54] METHOD FOR MANUFACTURING A FLAT-PANEL DISPLAY

[75] Inventors: Kyung-seob Kim; Chi-woo Kim; Young-chan Kweon; Won-kie Chang, all of Seoul, Rep. of Korea

[73] Assignee: Samsung Electronics Co., Ltd., Suwon, Rep. of Korea

[21] Appl. No.: 241,856

[22] Filed: May 12, 1994

[30] Foreign Application Priority Data

May 12, 1993 [KR] Rep. of Korea .................. 93-8171

[51] Int. Cl.$^6$ ................................. H01L 21/786
[52] U.S. Cl. ................ 437/51; 437/235; 437/246; 437/187; 437/983; 148/DIG. 118
[58] Field of Search .................. 437/51, 40, 236, 437/983, 60, 237, 235, 246; 148/DIG. 117, DIG. 118

[56] References Cited

U.S. PATENT DOCUMENTS

| | | | |
|---|---|---|---|
| 3,466,719 | 9/1969 | Sharif et al. | 437/919 |
| 3,967,371 | 7/1976 | Croset et al. | 437/195 |
| 4,420,378 | 12/1983 | Tsuboi et al. | 205/174 |
| 4,456,506 | 6/1984 | Stein et al. | 205/51 |
| 4,469,568 | 9/1984 | Kato et al. | 148/DIG. 117 |
| 4,526,671 | 7/1985 | Watanabe et al. | 205/147 |
| 5,146,301 | 9/1992 | Yamamura et al. | 257/57 |
| 5,202,274 | 4/1993 | Bae et al. | 437/40 |
| 5,240,868 | 8/1993 | Bae et al. | 437/237 |
| 5,334,544 | 8/1994 | Matsuoka et al. | 437/40 |
| 5,397,719 | 3/1995 | Kim et al. | 437/51 |

FOREIGN PATENT DOCUMENTS 57-187556  11/1982  Japan .

*Primary Examiner*—Michael Trinh
*Attorney, Agent, or Firm*—Cushman Darby & Cushman, IP Group of Pillsbury Madison & Sutro LLP

[57] ABSTRACT

A liquid crystal display having a gate insulating film of whose dielectric constant is a high and exhibits excellent leakage characteristics, includes a plurality of gate wirings formed on the transparent substrate, a plurality of signal lines arrayed to intersect the plurality of gate wirings, a plurality of switching devices located at the point of intersection between the respective gate wirings and signal lines. The switching device comprises a gate electrode constituted by aluminum or an aluminum alloy and a gate insulating film inserted between the channels of switching devices and the gate electrode. The gate insulating film has a first anodic oxide film constituted by aluminum or an aluminum alloy and a second anodic oxide film constituted by tantalum or a tantalum alloy. In the manufacturing method thereof, metals, aluminum or tantalum, are simultaneously anodically oxidized so as to suppress a hillock. An insulating layer having a high dielectric constant can be easily obtained while a leakage current characteristic is strengthened and its breakdown voltage is improved. A glass substrate can be protected since second and third anodic oxide films ($Ta_2O_5$) are formed on the entire surface of the substrate.

10 Claims, 17 Drawing Sheets

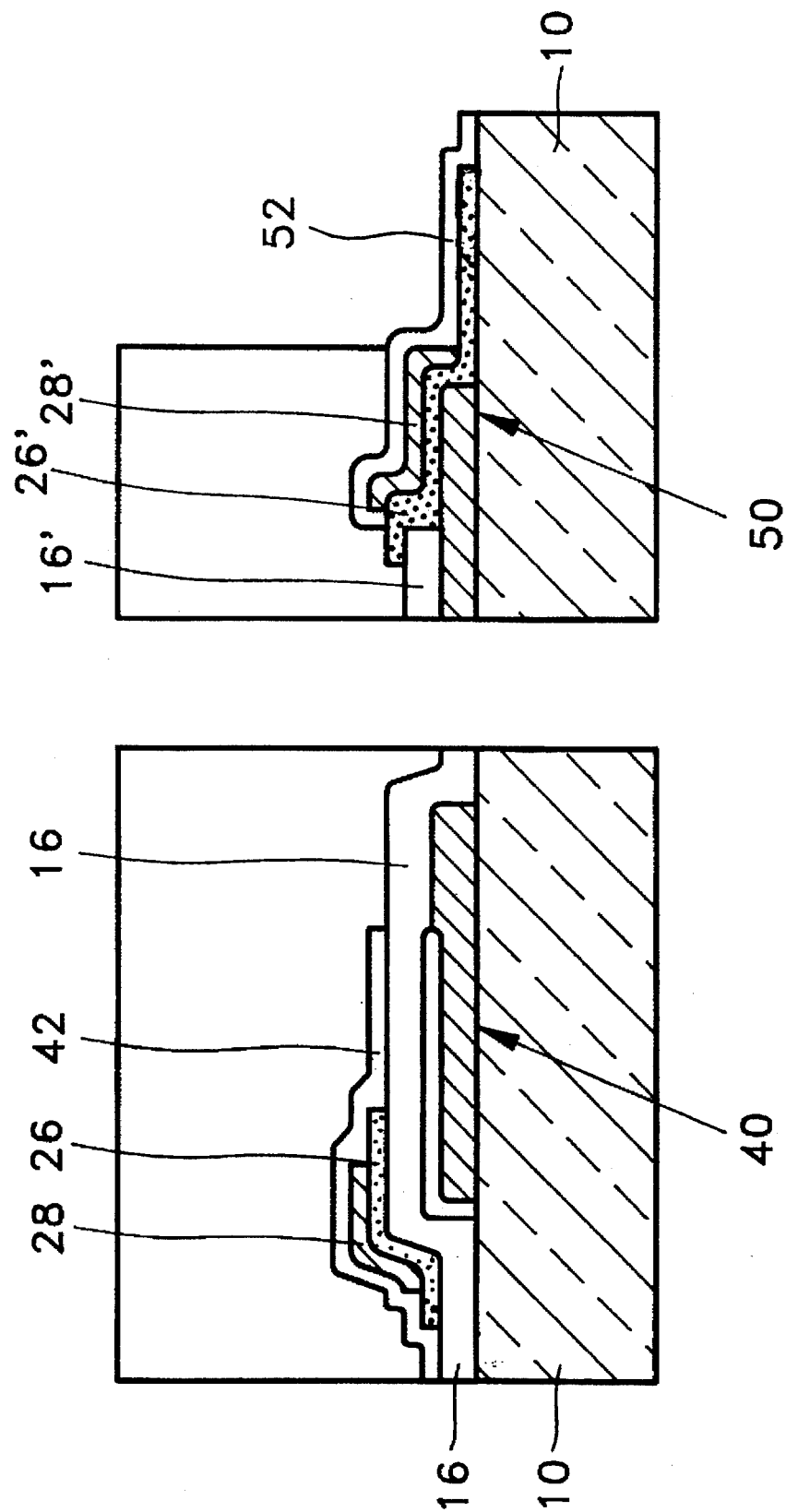

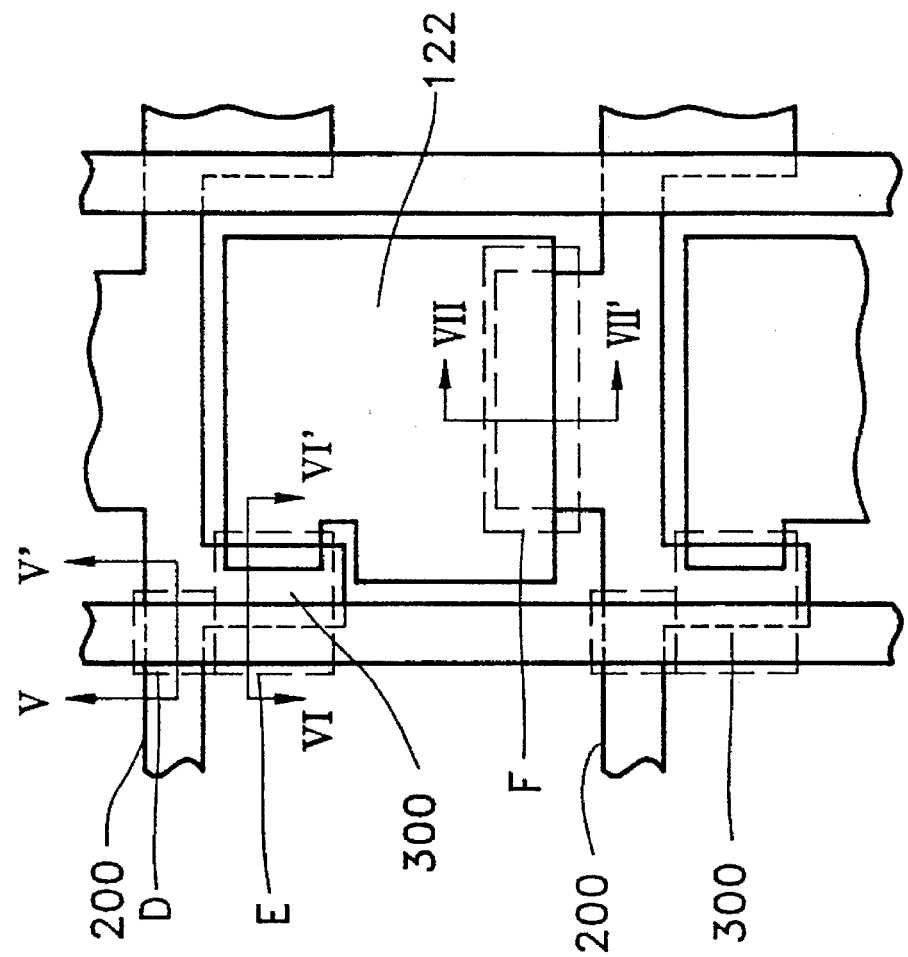

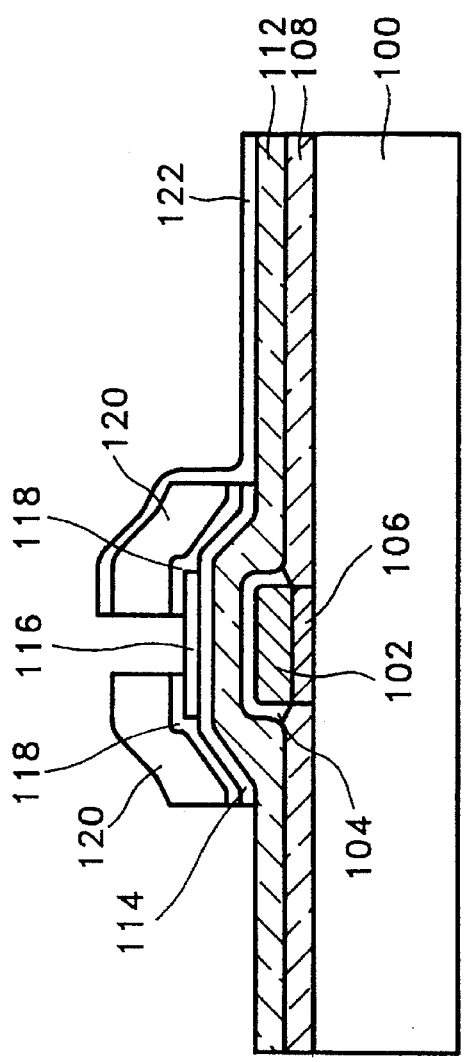
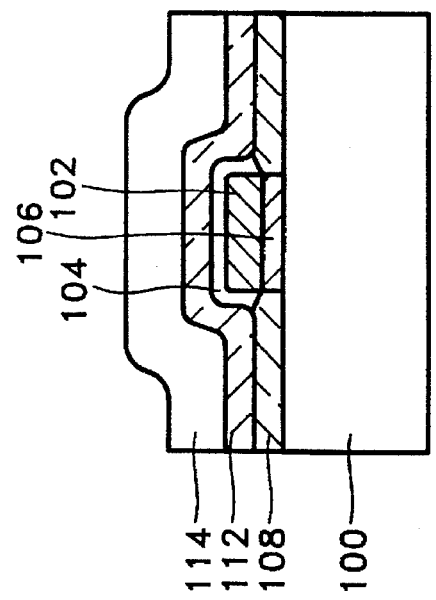

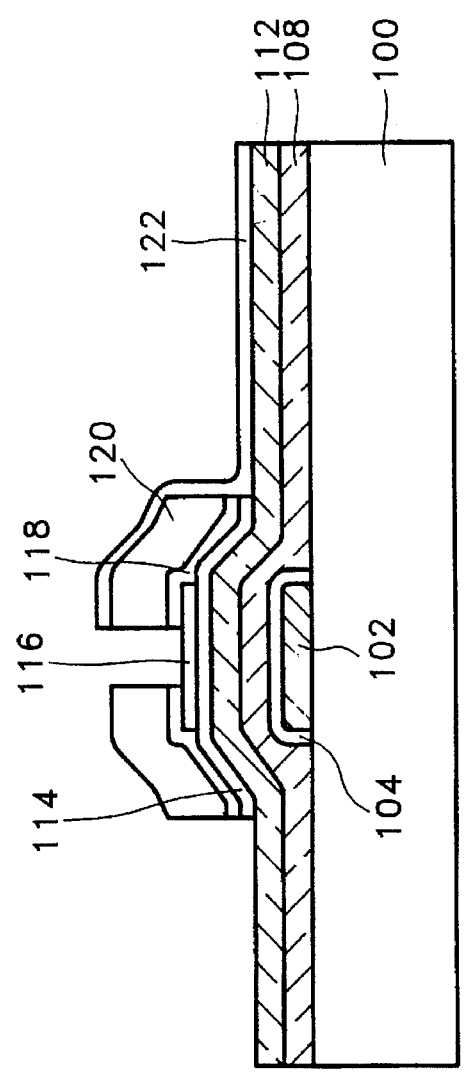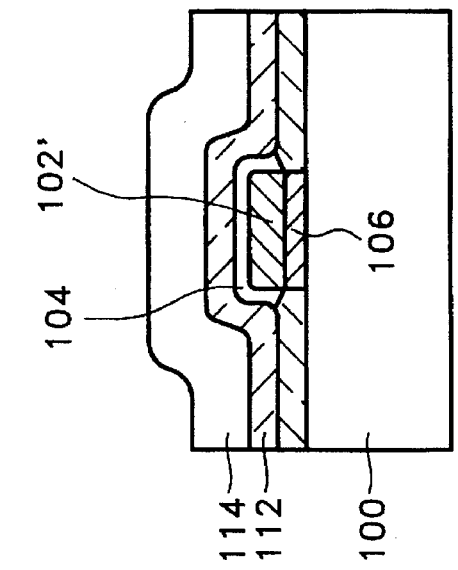

METHOD FOR MANUFACTURING A FLAT-PANEL DISPLAY

BACKGROUND OF THE INVENTION

The present invention relates to a method for manufacturing a flat panel display. More particularly, the present invention is directed to a method for manufacturing a liquid crystal display (LCD) having a gate insulating film with a high dielectric constant and excellent leakage characteristics.

As a next-generation display device intended to replace cathode ray tubes (CRTs), liquid crystal displays (LCDs) have been developed in parallel with the technological advancements in portable computers, office automation equipment and workstations, and high definition televisions. Such LCDs can have either a simple matrix form or an active matrix form which utilize the electro-optic properties of a liquid crystal, whose molecular arrangement is varied according to an applied electric field. Specifically, active-matrix LCDs utilize a combination of liquid crystal technology and semiconductor technology, and are recognized as being generally superior to CRT displays.

As LCDs achieve higher definition and wide-screen capabilities, more gate lines and a smaller pixel area inevitably reduces line width, thereby slowing the gate response time. To improve this situation, there is a technique which uses a low-resistance metal (e.g., aluminum) as the gate line, and then uses anodic oxidation to form a gate insulating film.

FIG. 1 shows a plan layout diagram of a conventional liquid crystal display. FIG. 2A to FIG. 2D are sectional views showing a liquid crystal display having an aluminum gate line and a double gate insulating film structure. In more detail, FIG. 2A is a sectional view taken along line I–I' of FIG. 1, showing a wiring matrix portion, FIG. 2B is a sectional view taken along line II–II' of FIG. 1, showing a thin film transistor (TFT) portion, FIG. 2C is a sectional view taken along line III–III' of FIG. 1, showing an additional capacitor portion, and FIG. 2D is a sectional view showing a terminal portion (not shown in FIG. 1).

As shown in FIG. 1 and FIG. 2A to FIG. 2D, an aluminum film is formed to a thickness of approximately 1,000 to 2,000 A on a substrate 10 by a sputter deposition method. Then, the aluminum is patterned so that a gate wiring 20 (FIG. 2A), a gate electrode 30 (FIG. 2B), a first additional capacity electrode 40 (FIG. 2C), and an electrode of terminal portion 50 (FIG. 2D) can be formed by the aluminum film. Then, a photoresist (not shown) is coated to a thickness of 3 μm, and portions of the photoresist formed on a wiring matrix portion A, on a TFT portion B and on an additional capacitor portion C (defined by dotted lines in FIG. 1) are removed by a photoetching process so as to expose these areas. Then, substrate 10 having the patterned aluminum formed thereon is dipped into an anodic oxidation solution, and a voltage of approximately 60 V to 80 V is supplied to the exposed aluminum layer for 30 minutes. Thus, an aluminum oxide ($Al_2O_3$) film 14 having a thickness of approximately 1,000 to 2,000 A is formed on the surface of the gate wiring 20 (FIG. 2A), the gate electrode 30 (FIG. 2B) and the first additional capacity electrode 40 (FIG. 2C). In other words, the aluminum layer exposed in regions A, B and C of FIG. 1 is partially and anodically oxidized.

Then, the photoresist is removed, and the resultant structure is heated to 200° to 400° C. for 60 minutes under atmospheric or vacuum conditions. Then, first silicon nitride layer 16 is formed on the $Al_2O_3$ film 14 to a thickness of 1,000 to 3,000 A by a chemical vapor deposition (CVD) method, and a first amorphous silicon layer 18 is formed to a thickness of 200 to 1,000 A thereon. Sequentially, a second nitride silicon layer 22 is formed to a thickness of 1,000 to 2,000 A on the first amorphous silicon layer 18. Then, the second nitride silicon layer 22 is patterned to form a second nitride silicon pattern 22 only on the channel of the TFT. Then, a second amorphous silicon layer 24 doped with phosphorous is formed to a thickness of 200 to 500 A on the first amorphous silicon layer 18 and the second nitride silicon pattern 22. Then, the second amorphous silicon layer 24 and the first amorphous silicon layer 18 are patterned to form simultaneously a second amorphous silicon pattern 24 and a first amorphous silicon pattern 18 under the source and drain regions of the TFT portion, as shown in FIG. 2B.

Then, chromium (Cr) and aluminum (Al) are sequentially deposited by a sputter deposition method to a thickness of 500 to 1,000 A and 3,000 to 8,000 A, respectively, and patterned so as to form a signal line 28, TFT source/drain electrodes 26 (FIG. 2B), and a terminal 26' and 28' (FIG. 2D). Then, a transparent electrode of indium-tin oxide (ITO) is formed to a thickness of approximately 1,000 A by a sputter deposition method and patterned, to thereby form a pixel electrode 32 (FIGS. 2A & 2B), an additional capacitor electrode 42 (FIG. 2C) and a pad terminal pattern 52 (FIG. 2D).

In the conventional method, anodic oxidation is performed using a solution of tartaric acid and an ethylene glycol or a solution of tartaric acid and propylene glycol. A heat treatment process is performed under atmospheric or vacuum conditions at 200° to 400° C. for 60 minutes after the anodic oxidization, and Al-3% Si or Al-0.3% Pd is used for gate wiring. In the conventional method, the double insulating layer structure of $Al_2O_3$/SiNx is used as a gate insulating film. Therefore, hillocks will not be generated on the surface of an aluminum and the insulating characteristic of the $Al_2O_3$ film can be thereby improved.

However, the gate line may be disconnected due to defects in the aluminum material and short circuiting among layers may occur due to the hillock growth caused by the heating process of a subsequent procedure, which lowers the yield.

In addition, the gate wiring and pad terminal patterns cannot be simultaneously formed due to the softness of the aluminum material and due to electro-chemical etching between the ITO film and the aluminum. Therefore, a chromium pad needs to be inserted between the aluminum film and gate wiring, which complicates the manufacturing process.

Moreover, since $Al_2O_3$/SiNx has to be used as a dielectric film of an additional or accumulated capacitor, leakage current and the dielectric constant are low compared with a case where a material such as $Ta_2O_5$/SiNx having a high dielectric constant is used. Therefore, the area of the additional or accumulated capacitor has to be increased in order to ensure the same capacitance, which may reduce the aperture ratio.

SUMMARY OF THE INVENTION

It is an object of the present invention to provide a flat panel display having a gate insulating film with a high dielectric constant and excellent leakage characteristics and an insulating film that can protect an underlying transparent substrate.

It is another object of the present invention to provide a method suitable for manufacturing the flat panel display.

According to the present invention, a double insulating film structure comprising a first anodic oxide film and a second anodic oxide film strengthens a leakage current characteristic. Thus, the generation of hillocks in a constituent metal layer can be prevented, and disconnection problems can be solved by forming a redundant wiring structure. Moreover, such a gate insulating film has an improved breakdown voltage and a high dielectric constant can be easily obtained. Further, second and third anodic oxide films are formed over the entire substrate, thereby protecting the substrate from erosion caused by a chemical gas reaction occurring in subsequent processing. Furthermore, the thickness of the anodic oxide film $Ta_2O_5$ formed evenly on the surface of the substrate is controlled to improve optical characteristics of the liquid crystal display at desired wavelengths.

BRIEF DESCRIPTION OF THE DRAWINGS

The above objects and advantages of the present invention will become more apparent by describing in detail a preferred embodiment thereof with reference to the attached drawings in which:

FIGS. 2A to FIG. 2C are sectional views taken along line I-I', line II-II' and line III-III' of FIG. 1, respectively, and FIG. 2D is a sectional view showing a conventional terminal portion (not shown in FIG. 1);

FIG. 8 is a plan layout view of the liquid crystal display device of the present invention;

FIG. 10A to FIG. 10C are sectional views taken along line V-V', line VI-VI' and line VII-VII' of FIG. 8, respectively.

FIG. 11A to FIG. 11C are sectional views taken along line V-V', line VI-VI' and line VII-VII' of FIG. 8, respectively.

DETAILED DESCRIPTION OF THE INVENTION

The present invention will be explained in more detail with reference to the attached drawings.

Figure 3:
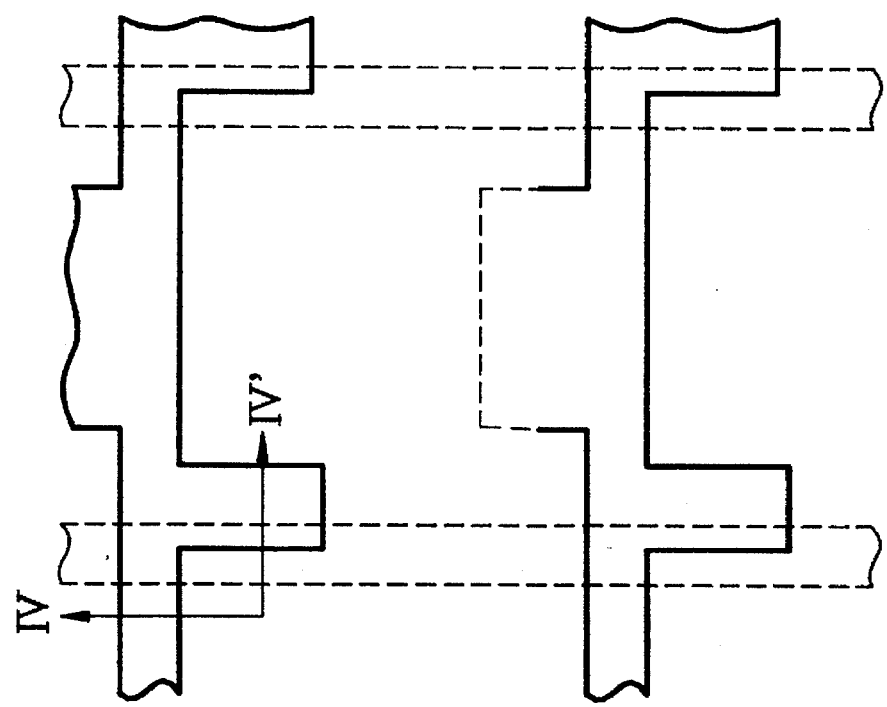
FIG. 3 is an example of a gate wiring layout of a liquid crystal display device according to the present invention.

FIG. 3 is an example of a gate wiring and gate electrode structure of the liquid display device and FIGS. 4A-4D, FIGS. 5A-5D, FIGS. 6A-6D and FIGS. 7A-7D are sectional views taken along line IV-IV' of FIG. 3 at various steps during the manufacturing process. Each series of FIGS. 4A-4D, 5A-5D, 6A-6D and 7A-7D, illustrate a flat panel display formed by a multi-step anodic oxidation according to a different embodiment of the present invention.

FIGS. 4A-4D illustrate steps in the process of forming a gate electrode portion and a gate wiring portion, formed by a multi-step oxidation method according to a first aspect of the present invention.

Figure 4A:
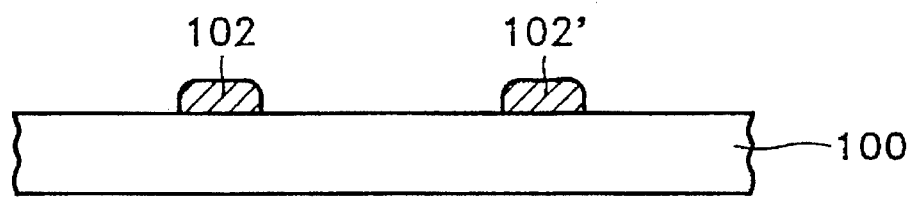
FIGS. 4A-4D, 5A-5D, 6A-6D and 7A-7D are sectional views taken along line IV-IV' of FIG. 3, for illustrating a flat panel display formed by a multi-step anodic oxidation according to the respective embodiments of the present invention.
Figure 4B:
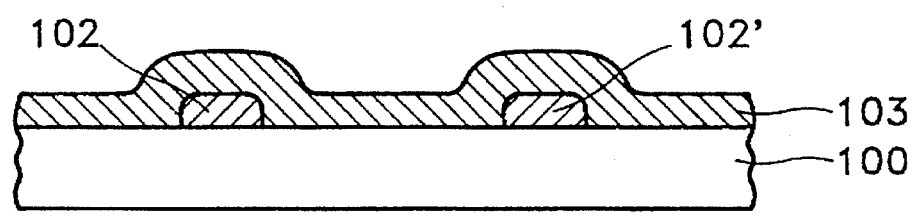
Figure 4C:
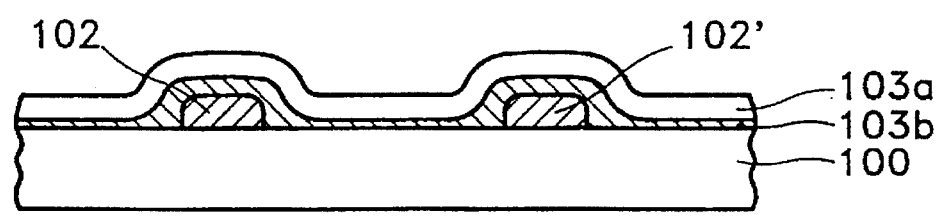
Figure 4D:
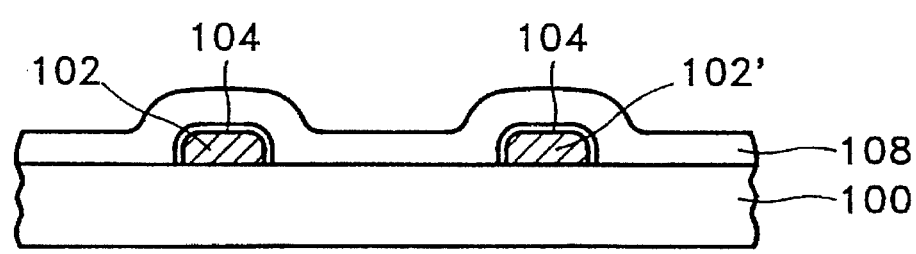

Referring to FIG. 4A, an aluminum or an aluminum alloy having a thickness of 1,000 to 10,000 A, is formed on a substrate 100 and then patterned to form first metal layers 102 and 102'. First metal layers 102 and 102' are used as a gate wiring portion and a gate electrode, respectively. Then, as shown in FIG. 4B, a second metal layer, (for example, tantalum (Ta) or a tantalum alloy) is formed over the entire substrate 100 including the first metal layers 102 and 102'. Then, as shown in FIG. 4C, the substrate 100 is dipped into an anodic oxide solution, whereby 50% to 98% of the thickness of the second metal layer is anodically oxidized to form layer 103a under a relatively low voltage so as to be entirely even. Then, as shown in FIG. 4D, a second anodic oxidation process is performed on the remaining second metal layer 103b and first metal layer 102 and 102' under a relatively high voltage compared with the first anodic oxidation process. At this time, since a current is supplied to the entire substrate via the remaining second metal layer, the entire surface of the second metal layer is very regularly and anodically oxidized to form a second anodic oxide film 108. First metal layer 102 is partially anodically oxidized, thereby forming a first anodic oxide film 104. The first anodic oxide film may be $Al_2O_3$, while the second anodic oxide film may be $Ta_2O_5$.

In addition, since the second metal layer (not shown) is formed over the entire substrate, the anodic oxidation has to be performed over the entire second metal layer in order to make the entire second metal layer transparent. Accordingly, the deposition thickness of the second metal layer varies depending on the maximum value of the applied anodic oxidation voltage because the thickness of the resultant anodic oxide film is in proportion to the applied voltage.

Here, the anodic oxidation is explained in more detail.

The thickness of the anodic oxide film is in proportion to the applied voltage when the metal is anodically oxidized. Therefore, the voltage corresponding to a thickness of an anodic oxide film which is to be anodically oxidized is fixed. And so the current and time are controlled so as to perform an anodic oxidation. The thickness of the metal layer anodically oxidized with respect to an anodic oxidation area, current, and time under the fixed voltage can be expressed as follows:

$$Tm = (C*I*t)/A$$

where, Tm is the thickness of an anodic oxide film, C is the anodic oxidation constant of the metal, I is current (mA), t is time (minutes), and A is the anodic oxidation area (cm$^2$).

In addition, when the surface of the deposited metal layer is anodically oxidized, the portion near the electrode is anodically oxidized before those portions more distant from the electrode because of the anodic oxidation rate difference depending on the distance from the electrode. Thus, the current supply is impeded in portions far from the electrode, so that an entirely even anodic oxide film can not be obtained. Accordingly, in the present invention, as a first step, preferably only 50% to 98% of the thickness of the second metal layer is initially anodically oxidized under a relatively low voltage. Then, as a second step, a current is supplied to the entire substrate under a high voltage via the second metal layer portion remaining unoxidized after the first step. Thus, the entire surface of the second metal layer is very evenly anodically oxidized on the surface of the substrate, and the first metal layer is partially anodically oxidized.

Therefore, when the metal layer is anodically oxidized according to the foregoing method, a anodic oxide film having a very even surface and high transmittivity throughout can be obtained.

FIGS. 5A–5D illustrate a method of forming a gate electrode portion and a gate wiring portion, formed by a multi-step oxidation method according to a second aspect of the present invention.

FIGS. 5A–5D are the same as FIGS. 4A–4D, except that second metal layers 106 and 106' (FIG. 5D) are first formed on substrate 100, and then first metal layers 102 and 102', serving as a gate wiring pattern and gate electrode, are formed on the second metal layers 106 and 106'.

Figure 1:
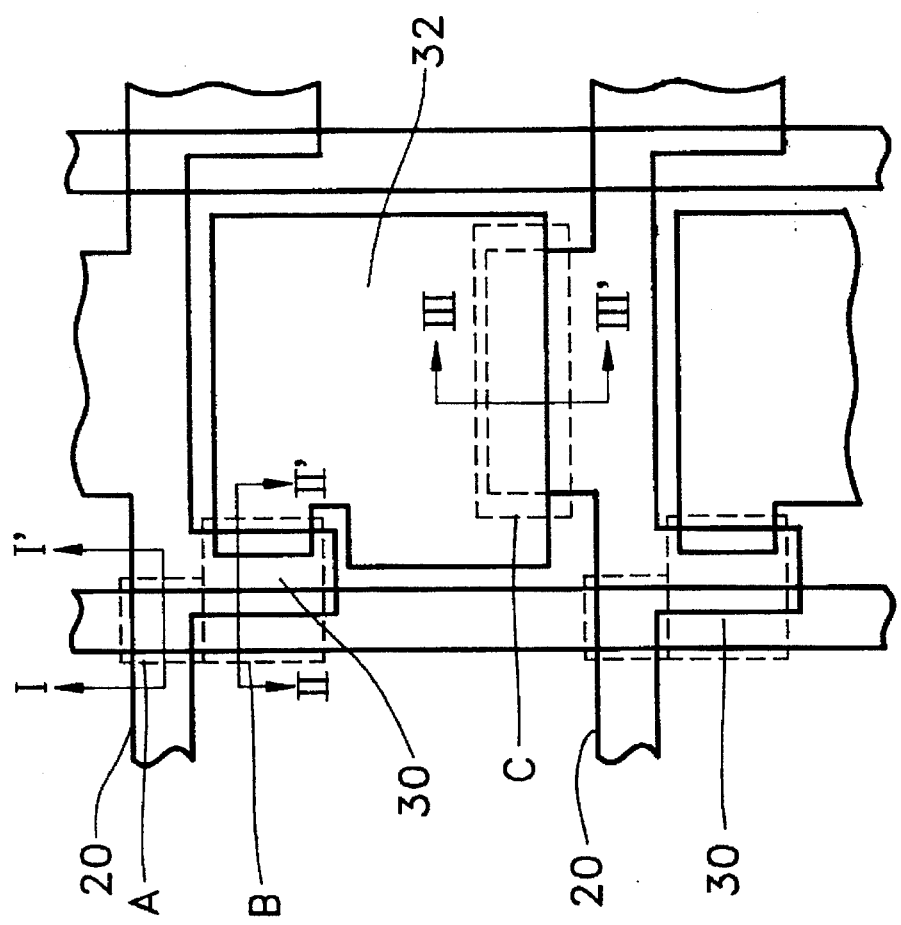
FIG. 1 is a plan layout view of a conventional liquid crystal display device.
Figures 2A, 2B:
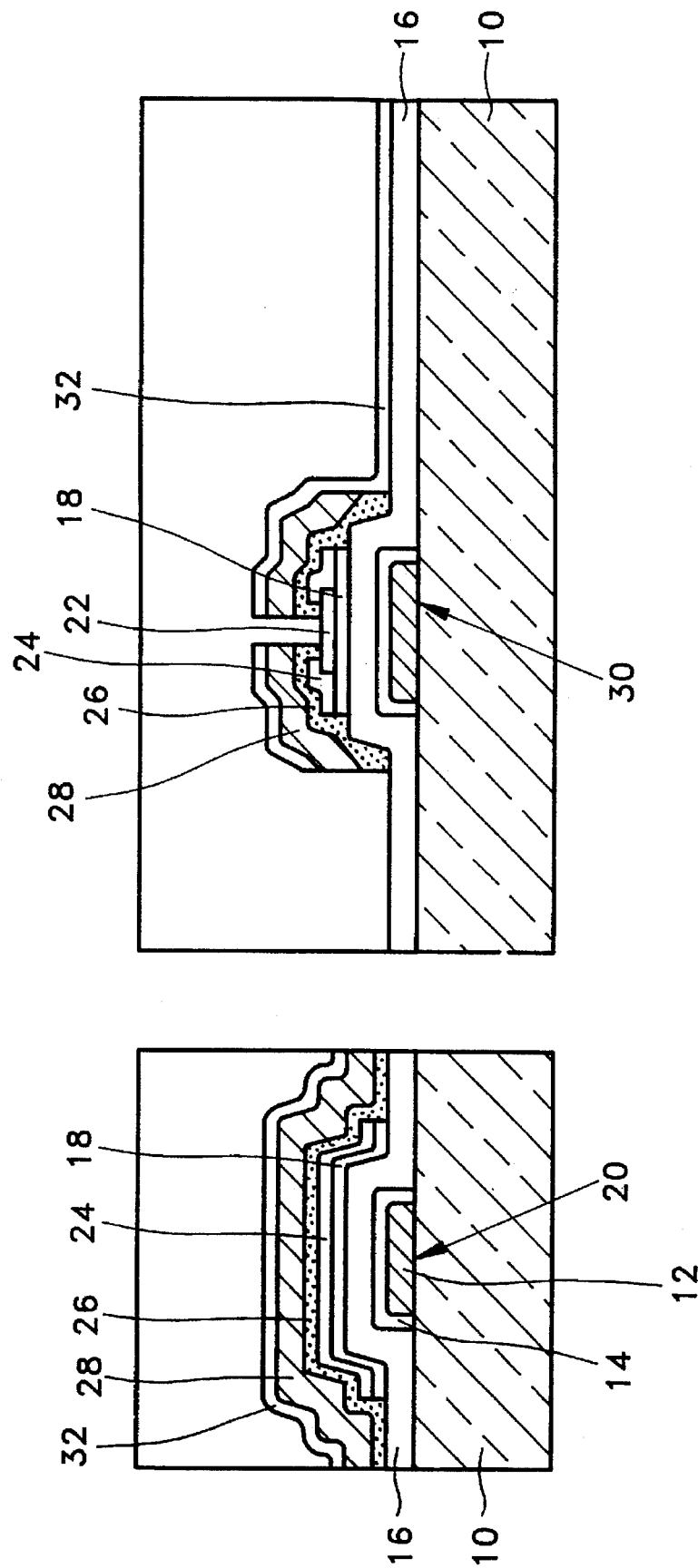
Figure 5A:
Figure 5B:
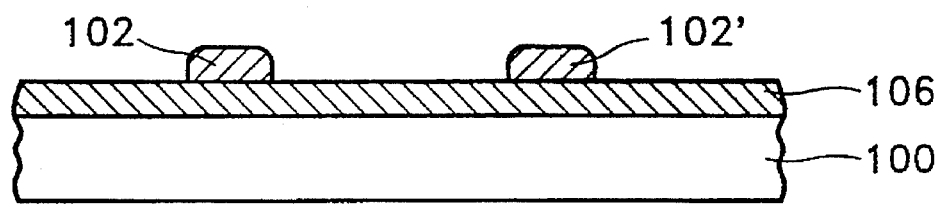
Figure 5C:
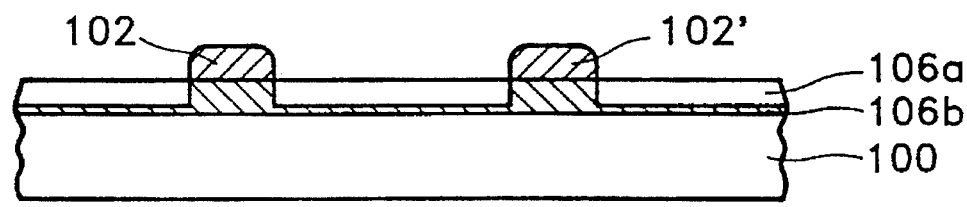

In more detail, as shown in FIG. 5A, a second metal layer 106, (for example, tantalum (Ta) or a tantalum alloy), is formed on substrate 100. Then, as shown in FIG. 5B, aluminum (Al) or an aluminum alloy is formed to a thickness of 1,000 to 10,000 A and patterned to form first metal layers 102 and 102'. The first metal layers 102 and 102' are used as a gate electrode and a gate wiring portion, respectively. Then, the substrate 100 is dipped into an anodic oxide solution, and between about 50% to 98% of the thickness of the second metal layer 106 is anodically oxidized under a relatively low voltage to be even (FIG. 2C). Then, an anodic oxidation is performed on the second metal layer 106 and a first metal layer 102 and 102' under a relatively high voltage.

Figure 5D:
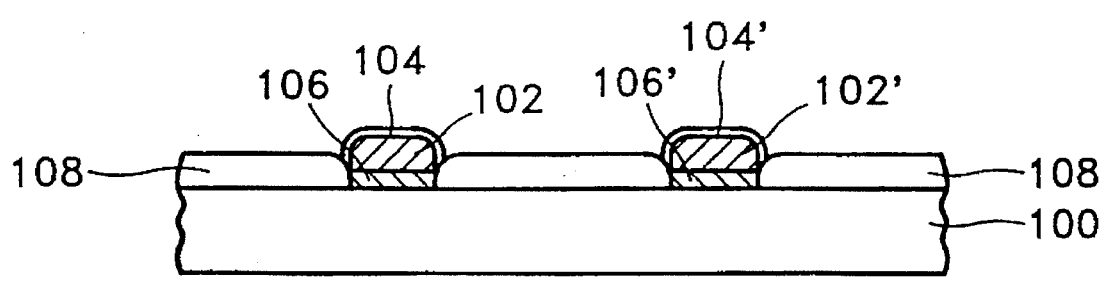
Figure 6A:
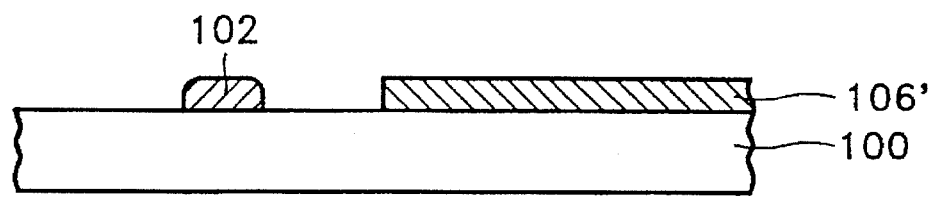
Figure 6B:
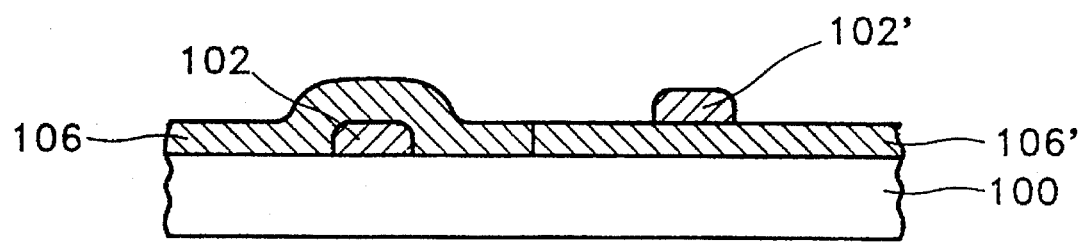
Figure 6C:
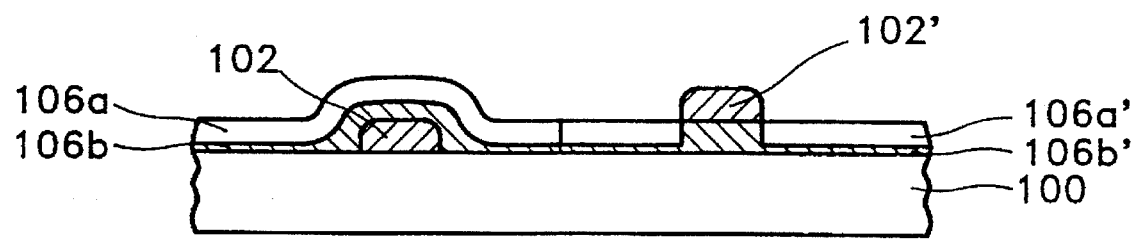
Figure 6D:
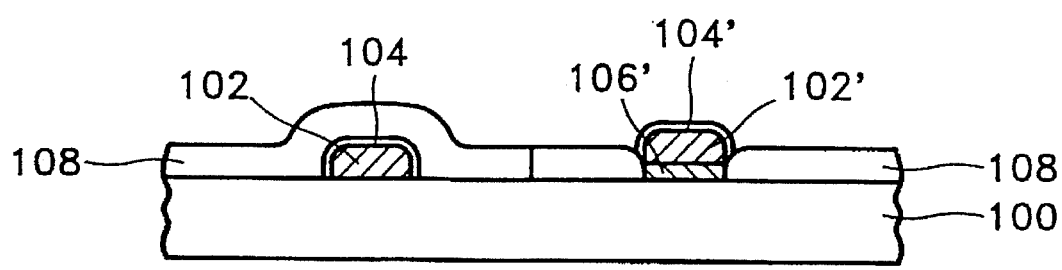

Thus, as shown in FIG. 5D, a second anodic oxide film 108 is formed very evenly, and first metal layer 102 and 102' are partially oxidized to form a first anodic oxide film 104. In addition, portions of the second metal layer 106 which are not anodic-oxidized 106, 106' remain under the gate electrode and gate wiring by self-alignment. Thus, the portions of second metal layer 106, 106' act as a redundancy wiring, so as to prevent complete gate wiring disconnection.

FIGS. 6A–6D illustrate a method of forming a gate electrode portion and a gate wiring portion, formed by a multi-step oxidation method according to a third aspect of the present invention.

In more detail, for the TFT gate electrode portion, a first metal layer 102 is formed and patterned, and then a second metal layer is formed thereon which is anodically oxidized in multiple steps as shown in FIGS. 4A–4D. Meanwhile, for the gate wiring, a second metal layer 106 is formed first on the substrate 100, and then a first metal layer 102' acting as a gate wiring pattern is formed thereon and is anodically oxidized in multiple steps as shown in FIGS. 5A–5D.

Thus, the structure shown in FIG. 6 is formed with the following characteristics. The first anodic oxide film 104, 104' is formed on the gate electrode and the gate wiring portion respectively, a second metal layer 106' is formed under the gate wiring 102', and a second anodic oxide film 108 is formed over the substrate.

FIGS. 7A–7D illustrate a method of forming a gate electrode portion and a gate wiring portion, formed by a multi-step oxidation method according to a fourth aspect of the present invention. FIGS. 7A–7D are the same as FIGS. 5A–5D except a that third anodic oxide film 110 is formed over the gate electrode portion and the gate wiring portion.

Figure 7A:
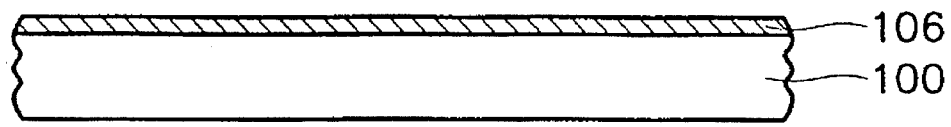
Figure 7B:
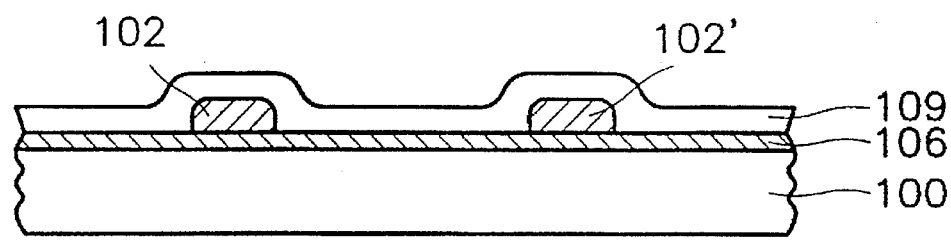
Figure 7C:
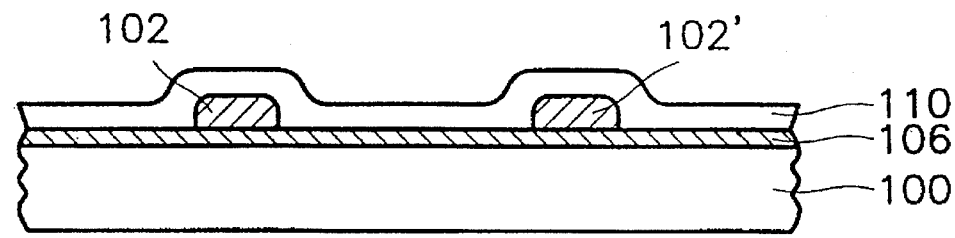
Figure 7D:
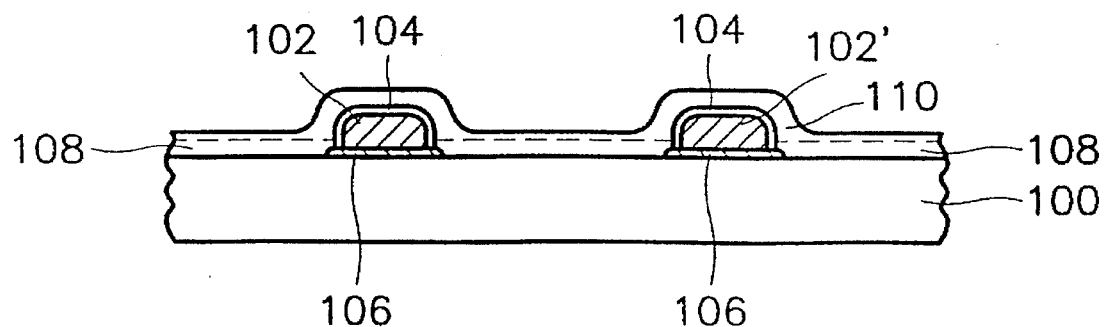

In more detail, a second metal layer 106 (for example, tantalum (Ta) or a tantalum alloy), is formed on substrate 100. Then, aluminum (Al) or an aluminum alloy is formed to a thickness of 1,000 to 10,000 A and patterned to form first metal layers 102 and 102' on the second metal layer 106. A two-step anodic oxidation process is then performed to form layer 108, as shown in FIGS. 7C–7D. At this time, the first metal layers 102 and 102', function as the gate wiring and the gate electrode, respectively. Then, as shown in FIG. 7D, a third metal layer composed of, for example, tantalum (Ta) or a tantalum alloy, is formed over the first metal layer 102 and 102'. Then, an anodic oxidation is performed on the first metal layer 102 and 102' and the third metal layer using the two-step anodic oxidation process described above. Thus, a third anodic oxide film 110 is formed on the gate electrode and gate wiring in addition to anodic oxide films 104 and 108. The third anodic oxide film 110 is the same as that of the second anodic oxide film 108, that is, $Ta_2O_5$.

The aluminum (or aluminum alloy) employed in forming the first metal layer has a resistance which is lower than that of the tantalum or tantalum alloy (for example, Ta—Mo) employed for the second and third metal layers by a factor of about ten. The first anodic oxide film $Al_2O_3$ has a leakage current level which is lower than that of the second and third anodic oxide films made of $Ta_2O_5$, and has a breakdown voltage of 7 MV/Cm which is almost the same as that of a silicon nitride film (SiNx).

In addition, since the second and third anodic oxide films $Ta_2O_5$ have a high dielectric constant the transconductance, $g_m$, of the TFT can be increased when the second and third anodic oxide films are employed as the dielectrics of a gate insulating film. Moreover, the area occupied by the additional capacitor can be reduced, thereby improving an aperture efficiency.

In addition, since the second and third anodic oxide films $Ta_2O_5$ have strong resistance against heat or acid, the films can be used as a substrate protector so that the substrate can be protected from stains or the deposited film can be protected from peeling.

In addition, hillocks on the first metal layer can be suppressed through the relaxation of the film stress between the first and second metal layers. Also, when the diffusion of the first metal layer molecules is activated, centering on crystal defects of the first metal layer at the boundary of the first and second metal layers, hillocks on the first metal layer can be suppressed. Thus, a gate electrode having a smooth surface can be formed. As a result, the TFT's operational characteristics can be improved and electrical short circuiting between the gate and the source/drain region can be prevented.

Further, the gate wiring has a double-structure having first and second metal layers to avoid the potential disconnection of the gate wiring. Moreover, the step coverage of the gate electrode, gate wiring, and the first additional capacity electrode can be improved by an anodic oxide film whose entire surface is anodically oxidized.

Preferred embodiments of the present invention will be explained in detail in reference with the accompanying drawings.

Figure 9B:
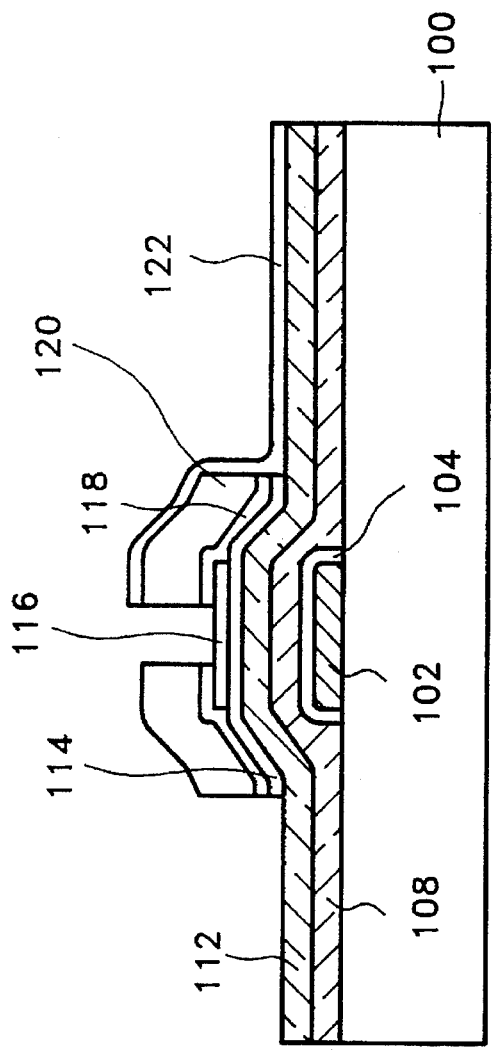
FIG. 9A to FIG. 9C are sectional views taken along line V-V', line VI-VI' and line VII-VII' of FIG. 8, respectively.
Figure 9A:
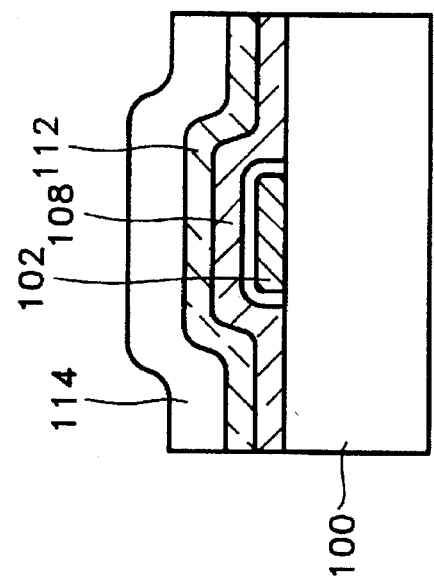
Figure 9C:
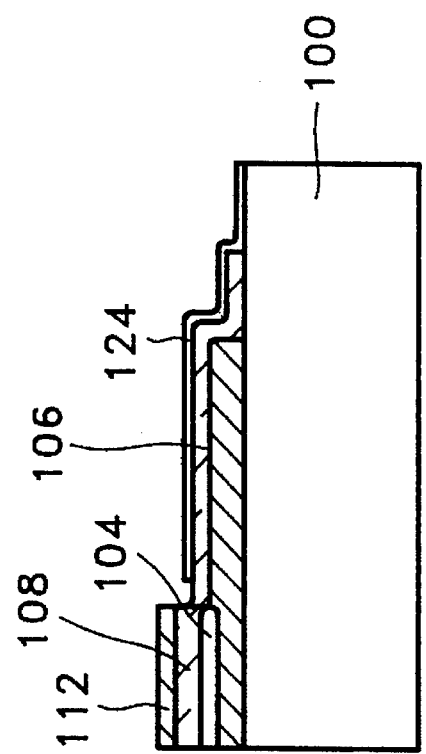
Figure 9D:
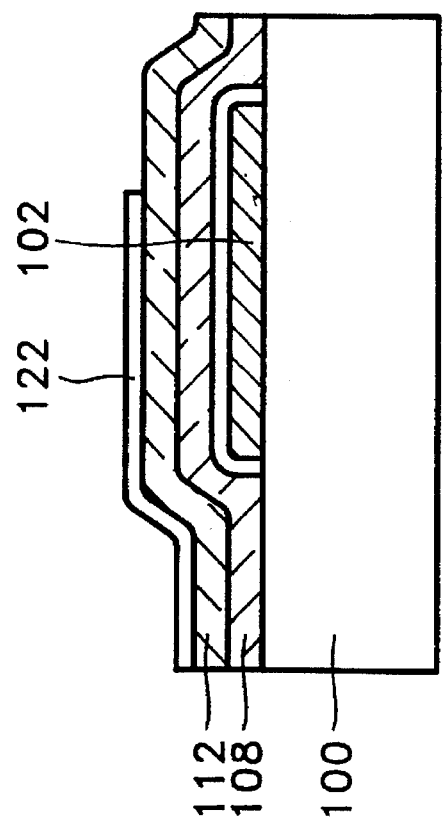
FIG. 9D is a sectional view showing a terminal portion, according to a first embodiment of the present invention.

FIG. 8 is a plan view of a layout of the liquid crystal display device of the present invention. FIG. 9A to FIG. 9D are sectional views illustrating a first embodiment of the present invention. In more detail, FIG. 9A is a sectional view taken along line V–V' of FIG. 8, showing a wiring matrix portion, FIG. 9B is a sectional view taken along line VI–VI' of FIG. 8, showing a thin-film transistor (TFT) portion, FIG. 9C is a sectional view taken along line VII–VII' of FIG. 8, showing an additional capacitor portion, and FIG. 9D is a sectional view showing a terminal portion (not shown in FIG. S).

Referring now to FIG. 9A to FIG. 9D, a gate electrode and a gate wiring are formed by a multi-step anodic oxidation process as shown in FIGS. 4A–4D. Here, aluminum or an aluminum alloy is formed to a thickness of approximately 1,000 to 10,000 A on a substrate 100 and then patterned to form a first metal layer 102. The first metal layer 102 is used as the gate wiring portion and gate electrode, and a first electrode of capacitor, respectively, as seen in FIGS. 9A–9C. Then, a second metal layer 106, such as tantalum (Ta), is formed to a thickness of 100 to 2,000 A on the resultant structure. Next, a photoresist is formed on the entire surface of the substrate and wiring and removed from selected areas D, E & F shown by dashed lines in FIG. 8. Anodic oxidation is then performed on the first and second metal layers 102, 106 by the two-step anodic oxidation method according to the present invention described with reference to FIG. 4. The thickness of the second anodic oxide film 108 generated when the second metal layer 106 is anodically oxidized is approximately 200 A to 500 A. When the anodic oxidation is performed, second metal layer 106 remains on the terminal portion of first metal layer 102 and serves as a terminal pad, as shown in FIG. 9D. Then, the photoresist pattern is removed. Then, an insulating material such as a nitride silicon or an oxide is deposited to form an insulating film 112. Then, amorphous silicon and nitride silicon are sequentially deposited to form a first amorphous silicon layer 114 and a nitride silicon layer 116, respectively. Then, nitride silicon layer 116 as an etch blocking layer is formed on the TFT channel in FIG. 9B by a common photo-etching process. Then, an impurity-doped (for example, phosphorous) amorphous silicon is deposited and metal for use as a signal line is deposited thereon to form a signal line 120 and the source/drain pattern 118 of the TFT by a common photo-etching process. At this time, amorphous silicon layer 114 is formed together. Then, the part of the insulating film 112 on the terminal portion is removed, and a transparent electrode material such as ITO is deposited and patterned, to thereby form pixel electrode 122 and a terminal pad 124, as seen especially in FIG. 9D. Then, the TFT substrate is completed by overlaying a protective film (not shown).

In the first embodiment, a gate insulating film of TFT portion is formed into a three-layer structure having first anodic oxide film $Al_2O_3$ 104, second anodic oxide film $Ta_2O_5$ 108, and silicon nitride film SiNx 112. Thus, excellent TFT operational characteristics can be obtained. The gate wiring is formed of aluminum, which decreases the gate time delay.

In addition, when anodic oxidation is performed, a tantalum layer is concurrently formed between the aluminum layer and the ITO film of the terminal portion, which enables the elimination of the metal pattern process for an additional terminal pad. Thus, the process is simplified and the transparent substrate can be protected by anodic oxide film 108 formed over the substrate. Therefore, the yield can be improved due to the simplified process.

FIG. 10A to FIG. 10D are sectional views illustrating a second embodiment of the present invention.

Figure 10D:
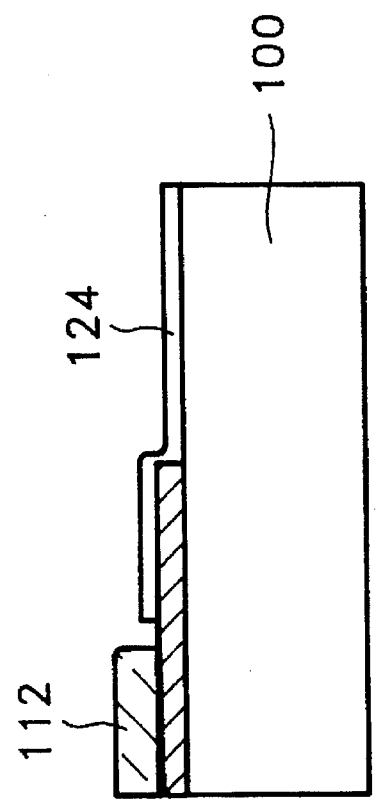
FIG. 10D is a sectional view showing a terminal portion, according to a second embodiment of the present invention.
Figure 10C:
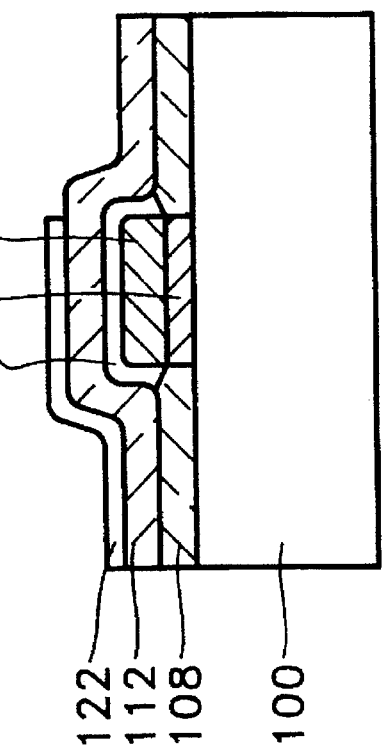

In more detail, FIG. 10A is a sectional view taken along line V–V' of FIG. 8, showing a wiring matrix portion, FIG. 10B is a sectional view taken along line VI–VI' of FIG. 8, showing a thin-film transistor (TFT) portion, FIG. 10C is a sectional view taken along line VII–VII' of FIG. 8, showing an additional capacitor portion, and FIG. 10D is a sectional view showing a terminal portion (not shown in FIG. 8).

In the second embodiment, as discussed with reference to FIGS. 5A–5D, a gate electrode and gate wiring are formed. The process subsequent to the multi-step anodic oxidation step is the same as that of the first embodiment.

In more detail, a second metal layer 106, (for example, tantalum (Ta)), is deposited to a thickness of 100 to 2,000 A on the surface of substrate 100. Then, a first metal layer 102, (for example, aluminum), is deposited to a thickness of 1,000 to 10,000 A and patterned (with second metal layer 106) by a common photoetching process, to thereby form a gate electrode, a gate wiring, and a first electrode of the capacitor. Then, a photoresist pattern (FIG. 8) is formed on first metal layer 102 formed on the terminal portion, and the two-step anodic oxidation described with reference to FIGS. 5A–5D is performed. The subsequent processing is the same as that of the first embodiment.

In the second embodiment, the second metal layer 106 is not anodically oxidized because of its self-alignment under the gate electrode and gate wiring. A gate insulating film is formed into a double film structure consisting of a first anodic oxide film ($Al_2O_3$) 104 and a silicon nitride film SiNx 112. An additional capacitor portion and a terminal portion are formed from the second metal layer (Ta) 106. Accordingly, the gate wiring and gate electrode are double-structured (Al/Ta), and the second metal layer serves as redundant wiring, thereby preventing the complete disconnection of the gate wiring.

FIG. 11A to FIG. 11D are sectional views illustrating a third embodiment of the present invention.

Figure 11D:
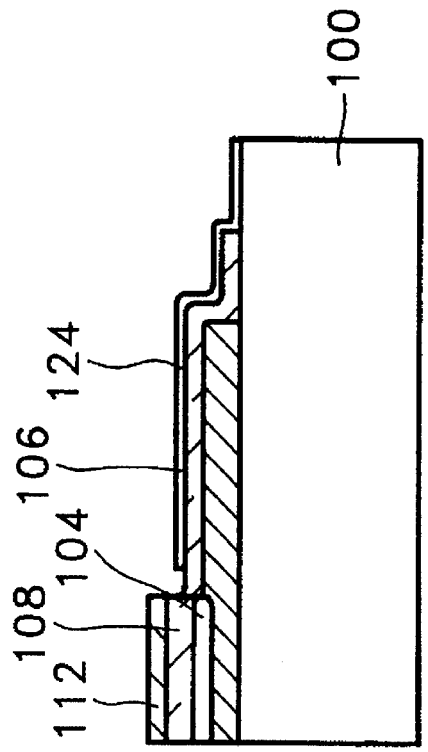
FIG. 11D is a sectional view showing a terminal portion, according to a third embodiment of the present invention.
Figure 11C:
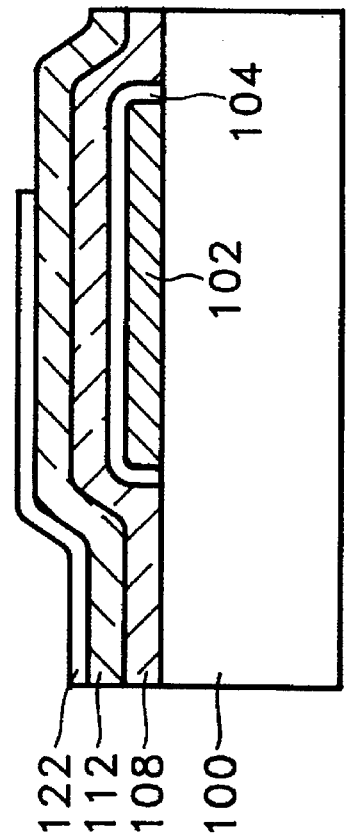

In more detail, FIG. 11A is a sectional view taken along line V–V' of FIG. 8, showing a wiring matrix portion, FIG. 11B is a sectional view taken along line VI–VI' of FIG. 8, showing a thin-film transistor (TFT) portion, FIG. 11C is a sectional view taken along line VII–VII' of FIG. 8, showing an additional capacitor portion, and FIG. 11D is a sectional view showing a terminal portion (not shown in FIG. 8).

In the third embodiment, a gate electrode and a gate wiring are formed as discussed with reference to FIGS. 6A–6D, and the process subsequent to the multi-step anodic oxidation is the same as that of the first embodiment.

In more detail, aluminum or an aluminum alloy is formed on substrate 100 and patterned to obtain a first metal layer 102. The first metal layer 102 is used as a gate electrode, a first electrode of capacitor and a pattern of a terminal portion, as seen in FIGS. 11B, 11C and 11D, respectively. Then, a second metal layer 106, (for example, tantalum (Ta)), is deposited to a thickness of 100 to 2,000 A on the whole surface of substrate 100. Then, aluminum or an aluminum alloy is formed on the second metal layer 106 and patterned to form a gate wiring 102' as seen in FIG. 11A.

Then, a photoresist pattern (FIG. 8) is formed. The two-step anodic oxidation is then performed as described with reference to FIG. 6. After the two-step anodic oxidation is performed, the same process as that of the first embodiment is performed.

Accordingly, the gate wiring according to the third embodiment is double-structured, comprising the second metal layer (Ta) and the first metal layer (Al). Also, the gate insulating film and the dielectric film of an additional capacitor in FIG. 11C are formed into a three-layer structure comprising the first anodic oxide film $Al_2O_3$, 104, the second anodic oxide film $Ta_2O_5$ 108, and the silicon nitride film SiNx 112. Thus, a disconnection problem of a gate wiring can be solved, the TFT characteristics can be improved, and an additional capacitance can be increased.

FIG. 12A to FIG. 12D are sectional views illustrating a fourth embodiment of the present invention.

Figure 12B:
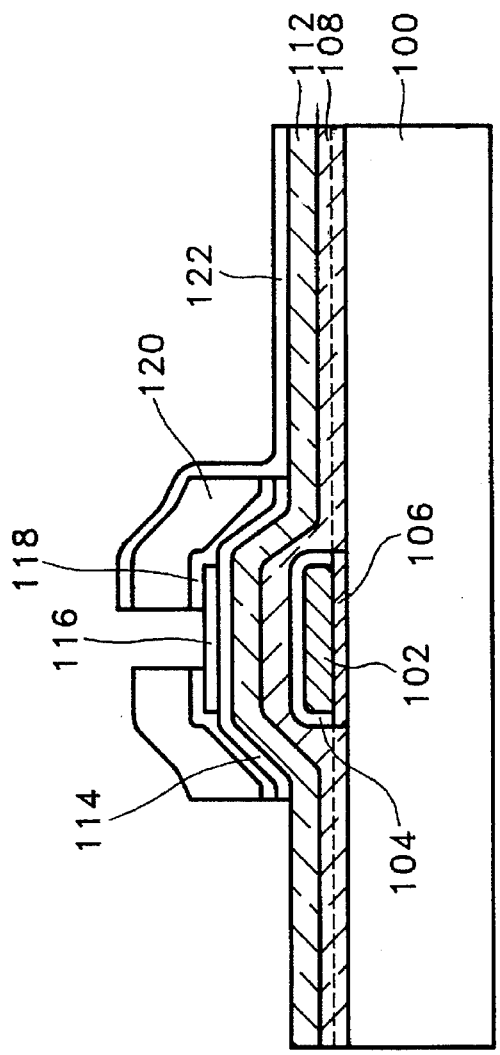
FIG. 12A to FIG. 12C are sectional views taken along line V-V', line VI-VI' and line VII-VII' of FIG. 8, respectively.
Figure 12A:
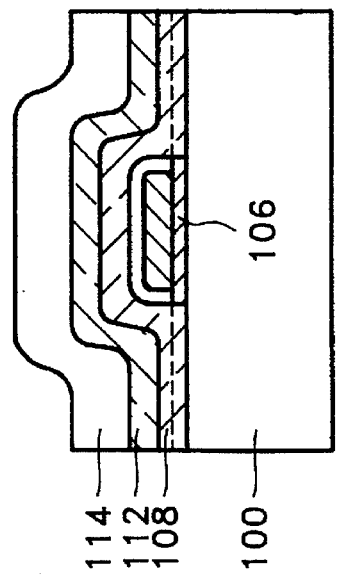
Figure 12D:
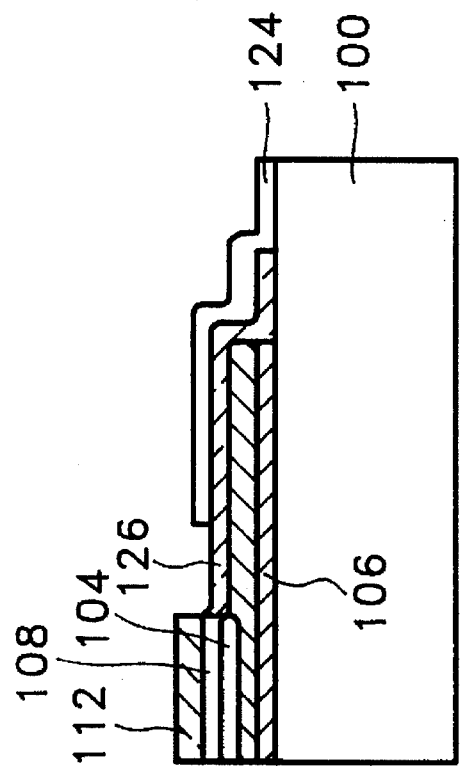
FIG. 12D is a sectional view showing a terminal portion, according to a fourth embodiment of the present invention.
Figure 12C:
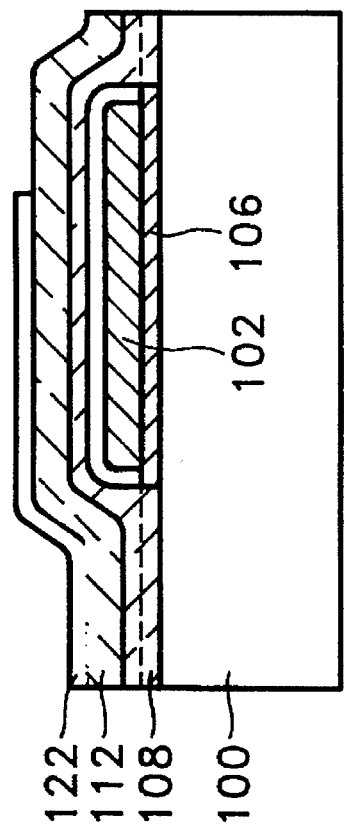

In more detail, FIG. 12A is a sectional view taken along line V–V' of FIG. 8, showing a wiring matrix portion, FIG. 12B is a sectional view taken along line VI–VI' of FIG. 8, showing a thin-film transistor (TFT) portion, FIG. 12C is a sectional view taken along line VII–VII' of FIG. 8, showing an additional capacitor portion, and FIG. 12D is a sectional view showing a terminal portion (not shown in FIG. 8).

In the fourth embodiment, a gate electrode and a gate wiring are formed as discussed with reference to FIGS.

7A–7D, and the process subsequent to the multi-step anodic oxidation process is the same as that of the first embodiment.

In more detail, tantalum (Ta) is deposited on the surface of substrate 100 to form a second metal layer 106. Then, aluminum is deposited to a thickness of 1,000 A to 10,000 A to form a first metal layer 102. The first and second metal layers act as a gate electrode and a gate wiring. Then, tantalum (Ta) or tantalum alloy is deposited on the surface of the gate electrode and the gate wiring, to form a third metal layer (not shown). Then, a photoresist pattern (not shown) is formed (FIG. 8) and then a two step-anodic oxidation is performed as discussed in connection with FIGS. 7A–7D to thereby anodically oxidize the third metal layer and form a third anodic oxide film 108 on a gate electrode and a gate wiring. Then, the same process as that of the first embodiment is performed.

Accordingly, in the fourth embodiment, the electrodes are formed with a double-structure consisting of a second metal layer 106 (Ta) and a first metal layer 102 (Al). Moreover, the insulating films among all the electrodes are formed with a three-layer structure consisting of first anodic oxide film $Al_2O_3$ 104, a third anodic oxide film $Ta_2O_5$ 108, and a silicon nitride film SiNx 112.

In t

In the present invention, a deposition structure of Al/Ta, Ta/Al, and Ta/Al/Ta is formed. Then, a two-step anodic oxidation is performed so as to anodically oxidize the entire surface of the tantalum (Ta) and to anodically oxidize part of aluminum (Al). Thus, the generation of aluminum hillocks can be prevented, and disconnection problems can be solved by forming a redundant wiring structure.

In addition, the leakage current characteristic in the device is strengthened while breakdown voltage is improved due to the double insulating film structure consisting of the first anodic oxide film $Al_2O_3$ and the second anodic oxide film $Ta_{2O3}$. Moreover, since an insulating film having a high dielectric constant can be easily obtained, interlayer shorting can be reduced, the TFT characteristics can be improved and an additional capacitance can be increased.

In addition, the second and third anodic oxide films $Ta_2O_5$ are formed on the entire surface of the glass substrate. Therefore, erosion of the glass substrate eroded by a chemical gas reaction of the sequential process can be prevented. Furthermore, the thickness of the anodic oxide film $Ta_2O_5$ formed evenly on the entire surface of the substrate is controlled so as to improve an optical characteristic of a liquid crystal display at a desired wavelength.

It will be understood by those skilled in the art that the foregoing description is a preferred embodiment of the disclosed device and that various changes and modifications may be made in the invention without departing from the spirit and scope thereof as defined by the appended claims.

What is claimed is:

1. A method for manufacturing a flat panel display comprising, the steps of:

forming a metal pattern on a substrate;

forming a metal layer on the substrate so as to cover the metal pattern formed thereon; and anodically oxidizing the metal pattern and the metal layer, whereby the metal pattern is partially oxidized and the metal layer is oxidized;

said step of anodically oxidizing the metal pattern and the metal layer comprising:

a first anodic oxidation step, wherein the metal layer is partially anodically oxidized under a first voltage, and a second anodic oxidation step, wherein the metal pattern is partially anodically oxidized and the partially anodically oxidized metal layer is anodically oxidized under a second voltage which is higher than the first voltage.

2. The method according to claim 1, wherein during the first anodic oxidation step, between 50% to 98% of a thickness of the metal layer is anodically oxidized.

3. The method according to claim 1, wherein metal layer comprises tantalum or a tantalum alloy.

4. The method according to claim 1, wherein metal pattern comprises aluminum or an aluminum alloy.

5. The method according to claim 1, wherein the metal pattern comprises a first metal, and the metal layer comprises a second metal, and wherein said step of forming the metal pattern comprises:

forming a first metal layer on the substrate; and photoetching the first metal layer to thereby obtain the metal layer pattern.

6. A method for manufacturing a flat panel display, comprising the steps of:

forming a metal pattern on a substrate;

forming a metal layer over the substrate having the metal pattern formed thereon;

forming a photoresist pattern on the metal layer, the photoresist pattern having openings formed therein which expose portions of the metal layer covering the metal pattern; and anodically oxidizing the metal pattern and the metal layer via the openings formed in the photoresist layer such that the metal pattern is partially anodically oxidized and the metal layer is anodically oxidized;

wherein said step of anodically oxidizing the metal pattern and the metal layer comprises:

a first anodic oxidation step, wherein the metal layer is partially anodically oxidized under a first voltage, and a second anodic oxidation step, wherein the metal pattern is partially anodically oxidized and the partially anodically oxidized metal layer is anodically oxidized under a second voltage which is higher than the first voltage.

7. A method according to claim 6, wherein said step of anodically oxidizing simultaneously forms a gate wiring portion, a gate electrode, and a first capacitor electrode on the substrate at the locations defined by the openings formed in the photoresist pattern.

8. A method according to claim 6, wherein the metal pattern is made from aluminum or an aluminum alloy.

9. A method according to claim 6, wherein the metal layer is made from tantalum or a tantalum alloy.

10. A method according to claim 6, wherein a portion of the metal layer covered by the photoresist pattern is not anodically oxidized during said step of anodically oxidizing and serves as a terminal pad.

* * * * *